(12) United States Patent
Deepak et al.

(10) Patent No.: US 10,325,898 B2
(45) Date of Patent: Jun. 18, 2019

(54) SEMICONDUCTOR DEVICE AND METHOD OF MANUFACTURING SEMICONDUCTOR DEVICE

(71) Applicant: Samsung Electronics Co., Ltd., Suwon-si (KR)

(72) Inventors: Sharma Deepak, Suwon-si (KR); Rajeev Ranjan, Hwaseong-si (KR); Kuchanuri Subhash, Hwaseong-si (KR); Chulhong Park, Seongnam-si (KR); Jaeseok Yang, Hwaseong-si (KR); Kwanyoung Chun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/635,615

(22) Filed: Jun. 28, 2017

(65) Prior Publication Data
US 2018/0130786 A1 May 10, 2018

(30) Foreign Application Priority Data
Nov. 9, 2016 (KR) .................. 10-2016-0149079

(51) Int. Cl.
| H01L 27/02 | (2006.01) |
| H01L 29/78 | (2006.01) |
| H01L 29/423 | (2006.01) |
| H01L 27/088 | (2006.01) |
| H01L 29/66 | (2006.01) |
| H01L 21/8234 | (2006.01) |
| H01L 27/092 | (2006.01) |

(52) U.S. Cl.
CPC ........ *H01L 27/0207* (2013.01); *H01L 27/088* (2013.01); *H01L 29/42372* (2013.01); *H01L 29/78* (2013.01); *H01L 21/823475* (2013.01); *H01L 27/092* (2013.01); *H01L 29/66545* (2013.01); *H01L 29/785* (2013.01); *H01L 29/7848* (2013.01)

(58) Field of Classification Search
CPC ........... H01L 27/0207; H01L 29/42372; H01L 27/088; H01L 29/66545; H01L 29/78
USPC .................................................. 257/369, 368
See application file for complete search history.

(56) References Cited

U.S. PATENT DOCUMENTS

| 8,173,491 B2 | 5/2012 | Law et al. |
| 8,863,063 B2 | 10/2014 | Becker et al. |
| 9,202,820 B1 | 12/2015 | Haigh |

(Continued)

FOREIGN PATENT DOCUMENTS

| JP | 5147654 B2 | 2/2013 |
| KR | 10-2016-0047380 A | 5/2016 |

*Primary Examiner* — Caleen O Sullivan
(74) *Attorney, Agent, or Firm* — Muir Patent Law, PLLC

(57) ABSTRACT

A semiconductor device includes a first active pattern extending in a first direction on a first region and a second region of a substrate, a first dummy gate electrode extending in a second direction crossing the first active pattern between the first region and the second region, a contact structure contacting the first dummy gate electrode and extending in the first direction, and a power line disposed on the contact structure and electrically connected to the contact structure. The power line extends in the first direction. The contact structure overlaps with the power line when viewed in a plan view.

20 Claims, 17 Drawing Sheets

(56) References Cited

U.S. PATENT DOCUMENTS

| | | | |
|---|---|---|---|
| 9,418,990 B2* | 8/2016 | Azmat | H01L 27/088 |
| 9,748,238 B2* | 8/2017 | Azmat | H01L 27/088 |
| 9,947,661 B2* | 4/2018 | Azmat | H01L 27/088 |
| 2015/0041924 A1 | 2/2015 | Moroz | |
| 2015/0311122 A1 | 10/2015 | Rashed et al. | |
| 2016/0099243 A1* | 4/2016 | Azmat | H01L 27/088 257/368 |
| 2016/0117431 A1 | 4/2016 | Kim et al. | |

* cited by examiner

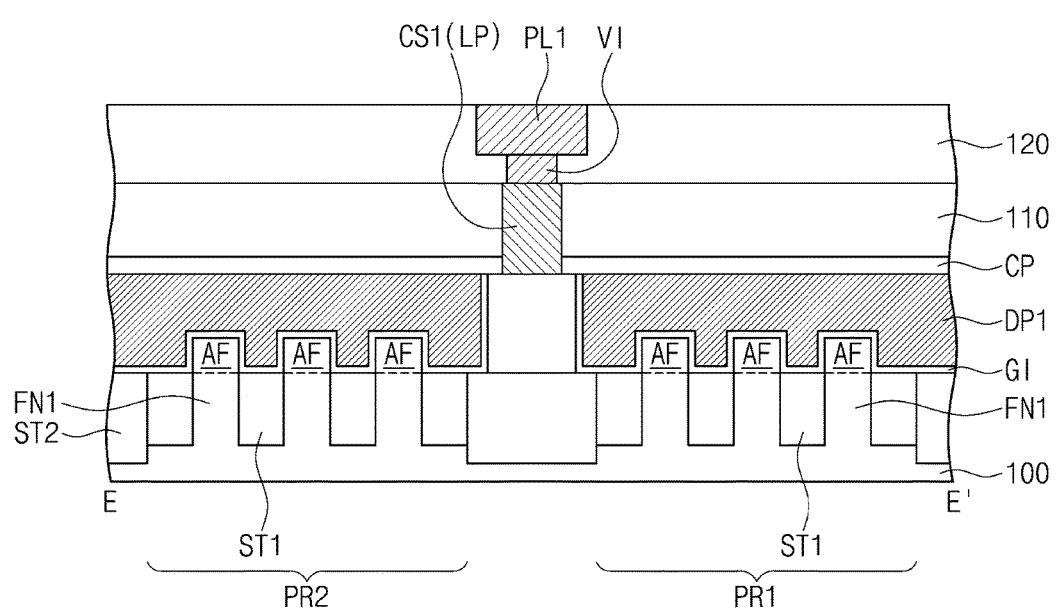

SEMICONDUCTOR DEVICE AND METHOD OF MANUFACTURING SEMICONDUCTOR DEVICE

CROSS-REFERENCE TO RELATED APPLICATION

This U.S. non-provisional patent application claims priority under 35 U.S.C. § 119 to Korean Patent Application No. 10-2016-0149079, filed on Nov. 9, 2016, in the Korean Intellectual Property Office, the disclosure of which is hereby incorporated by reference in its entirety.

BACKGROUND

Embodiments of the present disclosure relate to a semiconductor device and a method of manufacturing a semiconductor device, more particularly, to a semiconductor device including a field effect transistor.

Semiconductor devices are widely used in the electronic industry because of their small sizes, multi-functional characteristics, and/or low manufacture costs.

Semiconductor devices may be categorized as any one of semiconductor memory devices storing logical data, semiconductor logic devices processing logic data, and hybrid semiconductor devices having both the function of the semiconductor memory devices and the function of the semiconductor logic devices. Demand for semiconductor devices with excellent characteristics has been increasing with the development of the electronic industry. For example, in the rapidly developing electronic industry, demand for high-reliable, high-speed, and/or multi-functional ability has been increasing for semiconductor devices. To meet this demand, semiconductor devices have been getting highly integrated and structures of semiconductor devices have been getting more complex.

SUMMARY

Embodiments of the present disclosure may provide a semiconductor device including a field effect transistor with improved electrical characteristics.

In an aspect, a semiconductor device may include a first active pattern extending in a first direction on a first region and a second region of a substrate, a first dummy gate electrode extending in a second direction crossing the first active pattern between the first region and the second region, a contact structure contacting the first dummy gate electrode and extending in the first direction, and a power line disposed on the contact structure and electrically connected to the contact structure. The power line may extend in the first direction. The contact structure may overlap with the power line when viewed in a plan view.

In an aspect, a semiconductor device may include a substrate including an active pattern, the active pattern having a pair of dopant regions and a depletion region between the pair of dopant regions, a dummy gate electrode on the depletion region, a contact structure disposed on the dummy gate electrode and connected to the dummy gate electrode, and a power line disposed on the contact structure and electrically connected to the contact structure. The contact structure may include a linear portion extending in a longitudinal direction of the power line, and a first protruding portion protruding from the linear portion and covering a top surface of the dummy gate electrode.

In an aspect, a semiconductor device may include a first standard cell, a second standard cell, a third standard cell and a fourth standard cell provided on a substrate; a first dummy gate electrode provided at a boundary between the first standard cell and the second standard cell; a contact structure provided at a boundary between the first standard cell and the third standard cell and a boundary between the second standard cell and the fourth standard cell; and a power line provided at the boundary between the first standard cell and the third standard cell and the boundary between the second standard cell and the fourth standard cell, wherein the first standard cell and the second standard cell are arranged in a first direction, wherein the third standard cell and the fourth standard cell are arranged in the first direction, wherein the first standard cell and the third standard cell are arranged in a second direction crossing the first direction, wherein the second standard cell and the fourth standard cell are arranged in the second direction, and wherein the power line applies a voltage to the first dummy gate electrode through the contact structure.

In an aspect, a semiconductor device may include an active pattern provided on a substrate extending in a first direction, the active pattern having a pair of source/drain regions and a depletion region between the pair of source/drain regions; a dummy gate electrode on the depletion region and extending in a second direction crossing the active pattern; a contact structure disposed on the dummy gate electrode and connected to the dummy gate electrode and extending in the first direction; and a via and a power line disposed on the contact structure, wherein the via is disposed between the contact structure and the power line, the via having a linear shape extending in the second direction and the power line having a linear shape extending along the via in the second direction, wherein the contact structure and the via overlap the power line when viewed in a plan view.

In an aspect, a method of manufacturing a semiconductor device may include: forming a first active pattern on a first region and a second region of a substrate, the first active pattern extending in a first direction on the first region and the second region; forming a first dummy gate electrode extending in a second direction crossing the first active pattern between the first region and the second region; forming a contact structure contacting the first dummy gate electrode and extending in the first direction; and forming a power line on the contact structure and electrically connected to the contact structure, the power line extending in the first direction, wherein the contact structure overlaps the power line when viewed in a plan view.

BRIEF DESCRIPTION OF THE DRAWINGS

The exemplary embodiments of the present disclosure will become more apparent in view of the attached drawings and accompanying detailed description.

FIGS. 5A to 5E are cross-sectional views taken along lines A-A', B-B', C-C', D-D', and E-E' of FIG. 4, respectively.

DETAILED DESCRIPTION OF THE EMBODIMENTS

Figure 1:
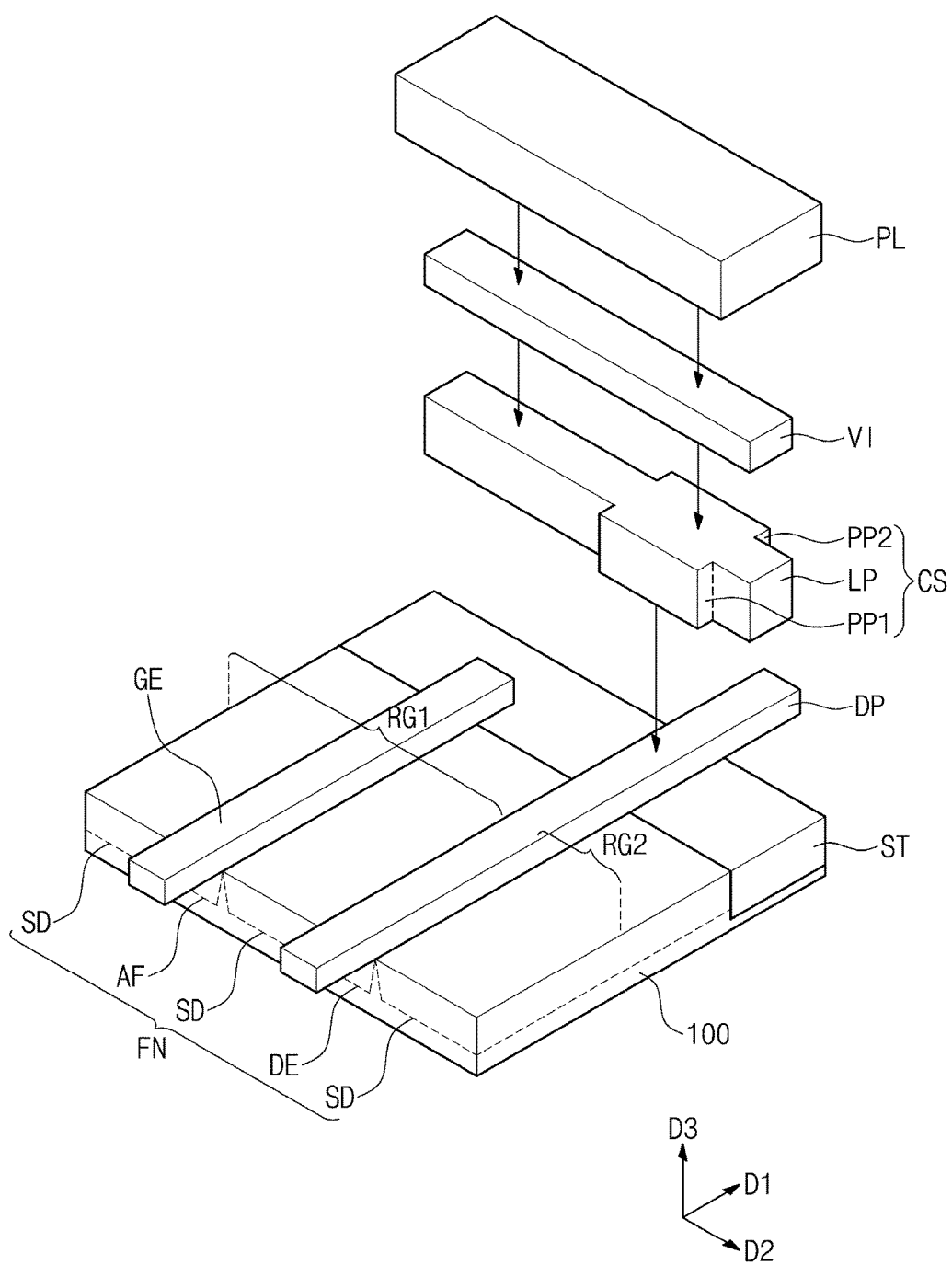
FIG. 1 is a perspective view illustrating a semiconductor device according to some exemplary embodiments of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a perspective view illustrating a semiconductor device according to some exemplary embodiments of the present disclosure.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, a substrate 100 having an active pattern FN and a device isolation pattern ST may be provided. The device isolation pattern ST may be provided in the substrate 100 to define the active pattern FN. The active pattern FN may include a first conductivity-type impurity, e.g., a P-type impurity in one embodiment or a second conductivity-type impurity, e.g., an N-type impurity in another embodiment. The device isolation pattern ST may include an insulating material, such as a silicon oxide film, a silicon nitride film, a silicon oxynitride film, a combination thereof. The active pattern FN may be disposed on a first region RG1 and a second region RG2 of the substrate 100.

The active pattern FN may include source/drain regions SD (also referred to as dopant regions), a channel region AF, and a depletion region DE. The channel region AF may be disposed between a pair of the source/drain regions SD adjacent to each other. The depletion region DE may be disposed between a pair of the source/drain regions SD adjacent to each other. The depletion region DE may be disposed between the first region RG1 and the second region RG2 of the substrate 100.

A gate electrode GE and a dummy gate electrode DP may be disposed to cross over the active pattern FN. The gate electrode GE and the dummy gate electrode DP may extend in a first direction D1 parallel to a top surface of the substrate 100. The gate electrode GE may be disposed on the channel region AF, and the dummy gate electrode DP may be disposed on the depletion region DE. Even though not shown in the drawings, a first gate insulating pattern may be disposed between the channel region AF and the gate electrode GE, and a second gate insulating pattern may be disposed between the depletion region DE and dummy gate electrode DP. Each of the gate electrode GE and the dummy gate electrode DP may include at least one of a doped semiconductor material, a conductive metal nitride (e.g., titanium nitride or tantalum nitride), or a metal (e.g., aluminum or tungsten). In some embodiments, the doped semiconductor material may include polycrystalline silicon doped with a P-type impurity or an N-type impurity.

In some embodiments, the dummy gate electrode DP may be a conductive line formed at the same level (or height) as gate electrode GE in a third direction D3 perpendicular to a top surface of the substrate 100, and adjacent to gate electrode GE (also referred to as normal gates). The dummy gate electrode DP may be patterned from the same conductive layer(s) forming the gate electrode GE. For example, the dummy gate electrode DP may be simultaneously formed with the gate electrode GE with the same processes that deposit and pattern the conductive layer(s) forming the gate electrode GE.

In some instances, the dummy gate electrode DP may not be connected or configured to receive a normal gate voltage that would be applied to the gate electrode GE (e.g., it may receive a different voltage level, or may receive a voltage at a different time from when a voltage is applied to one of the gate electrodes GE). For example, the dummy gate electrode DP may be connected and configured to receive the same voltage applied to a source or drain of a standard cell or of a transistor adjacent to the dummy gate electrode DP (e.g., applied to a power line PL as described further below).

The dummy gate electrode DP may overlap and cross over the device isolation pattern ST. The gate electrode GE may not completely cross over the device isolation pattern ST. For example, one end of the dummy gate electrode DP may protrude in the first direction D1 more than one end of the gate electrode GE.

A contact structure CS may be disposed on the dummy gate electrode DP. The contact structure CS may be in contact with a top surface of the dummy gate electrode DP. A bottom surface of the contact structure CS may be disposed at substantially the same height (or level) in a third direction D3 perpendicular to a top surface of the substrate 100 as the top surface of the dummy gate electrode DP. The bottom surface of the contact structure CS may be disposed at substantially the same height (or level) in the third direction D3 perpendicular to the top surface of the substrate 100 as a top surface of the gate electrode GE, but the contact structure CS may be spaced apart from the gate electrode GE in the first direction D1. This may be because the one end of the gate electrode GE does not extend in the first direction D1 parallel to the top surface of the substrate 100 to be in contact with the contact structure CS.

The contact structure CS may include a linear portion LP, a first protruding portion PP1, and a second protruding portion PP2. The linear portion LP may have a linear shape extending in a second direction D2 crossing the first direction D1. A longitudinal direction of the linear portion LP may be the second direction D2. The first protruding portion PP1 may protrude from the linear portion LP in a direction opposite to the first direction D1 (e.g., a direction from the device isolation pattern ST to the active pattern FN). The second protruding portion PP2 may protrude from the linear portion LP in the first direction D1. For example, the second protruding portion PP2 may protrude from the linear portion LP in a direction opposite to the extending direction of the first protruding portion PP1. Since the linear portion LP and the first and second protruding portions PP1 and PP2 are in contact with the dummy gate electrode DP, a contact area between the contact structure CS and the dummy gate electrode DP may relatively increase. As a result, a resistance between the contact structure CS and the dummy gate electrode DP may be relatively reduced. The contact structure CS may include at least one of a conductive metal nitride (e.g., titanium nitride or tantalum nitride) or a metal (e.g., aluminum or tungsten).

A via VI and a power line PL may be disposed on the contact structure CS. The via VI may be disposed between the contact structure CS and the power line PL. The via VI may have a linear shape extending along the linear portion LP in the second direction D2. The power line PL may have a linear shape extending along the via VI in the second direction D2. A longitudinal direction of the power line PL may be the second direction D2. In some embodiments, a width of the power line PL in the first direction D1 may be greater than a width of the via VI in the first direction D1. In some embodiments, a width of the power line PL in the first direction D1 may also be greater than a width of the contact structure CS in the first direction D3. The contact structure CS and the via VI may overlap the power line PL when viewed in a plan view. Even though not shown in the drawings, the power line PL and the via VI may be integrally formed. For example, the power line PL and the via VI may be connected to each other to constitute one body. Each of the power line PL and the via VI may include at least one of a conductive metal nitride (e.g., titanium nitride or tantalum nitride) or a metal (e.g., aluminum or tungsten).

In some embodiments, the contact structure CS, the via VI, and the power line PL may have linear shapes extending in parallel to each other. Thus, a contact area between the contact structure CS and the via VI may relatively increase and a resistance therebetween may be relatively reduced.

The power line PL, for example, may be a line connected to a terminal of an integrated circuit and/or a transistor that uses a power (e.g., voltage) for operation. The power line PL may apply a power voltage or a ground voltage to the dummy gate electrode DP through the via VI and the contact structure CS. In some embodiments, when the active pattern FN is a P-channel metal-oxide-semiconductor (PMOS) active region, a power voltage may be applied to the dummy gate electrode DP. Thus, the depletion region DE may be formed under the dummy gate electrode DP. The depletion region DE may block or interrupt movement of carriers between the first region RG1 and the second region RG2 in the active pattern FN. The active pattern FN of the first region RG1 may be electrically isolated from the active pattern FN of the second region RG2 by the dummy gate electrode DP. In certain embodiments, when the active pattern FN is an N-channel metal-oxide-semiconductor (NMOS) active region, a ground voltage may be applied to the dummy gate electrode DP. Thus, the depletion region DE may be formed under the dummy gate electrode DP.

Figure 2:
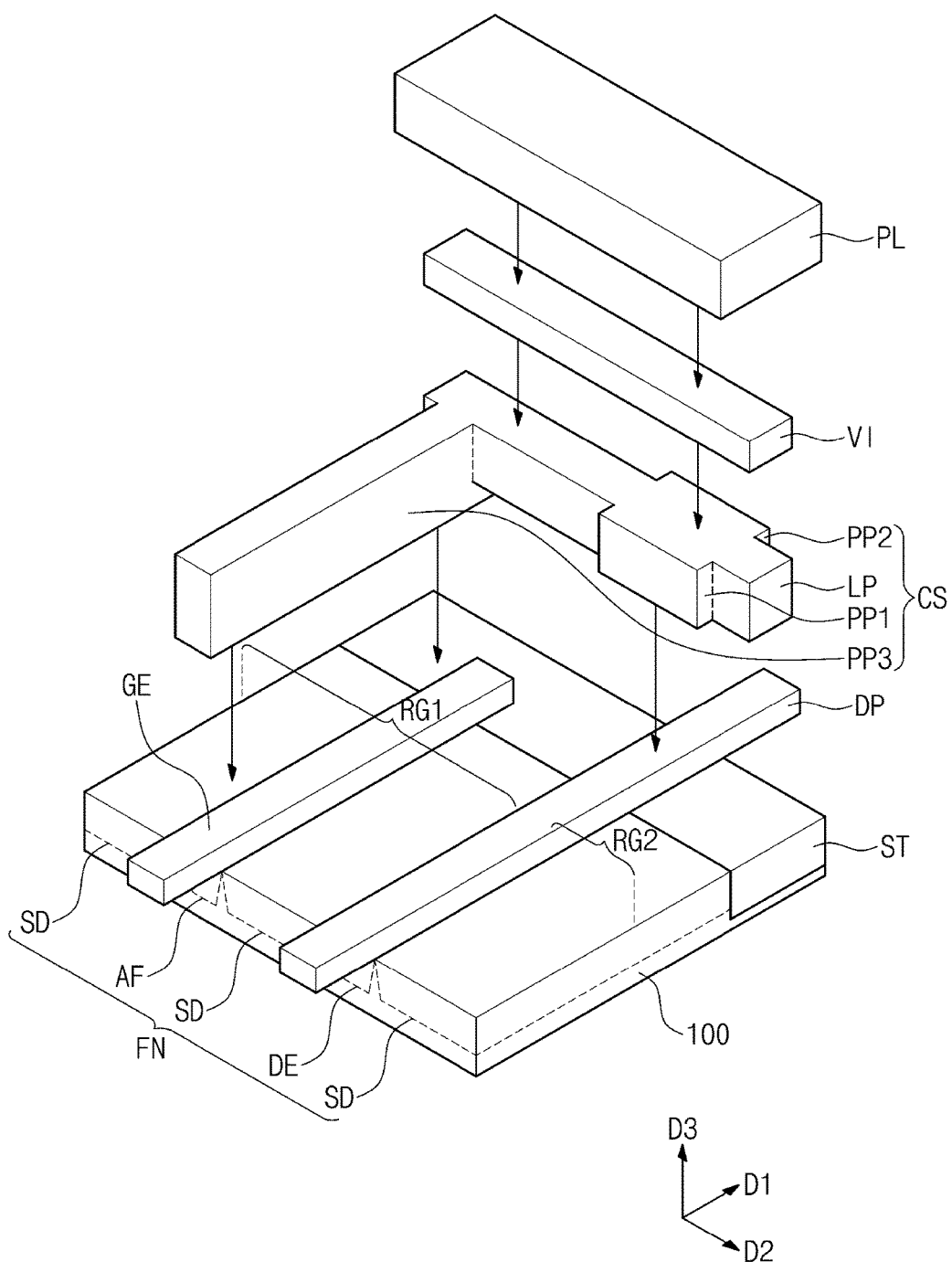
FIG. 2 is a perspective view illustrating a semiconductor device according to some exemplary embodiments of the present disclosure.

FIG. 2 is a perspective view illustrating a semiconductor device according to some embodiments of the present disclosure. In this exemplary embodiment, the descriptions to the same technical features as in the above embodiment of FIG. 1 will be omitted or mentioned briefly for the purpose of ease and convenience in explanation. For example, differences between this exemplary embodiment and the embodiment of FIG. 1 will be mainly described hereinafter.

Referring to FIG. 2, a contact structure CS may further include a third protruding portion PP3. The third protruding portion PP3 may protrude from the linear portion LP in the direction opposite to the first direction D1 (e.g., a direction from the device isolation pattern ST to the active pattern FN). The third protruding portion PP3 may have a linear shape. A height of a bottom surface of the third protruding portion PP3 may be different from heights of bottom surfaces of the linear portion LP, the first protruding portion PP1, and the second protruding portion PP2. In some embodiments, the height of the bottom surface of the third protruding portion PP3 may be lower than the heights of the bottom surfaces of the linear portion LP, the first protruding portion PP1, and the second protruding portion PP2. The height of the bottom surface of third protruding portion PP3 may refer to a distance from a top surface of the substrate 100 to the bottom surface of the third protruding portion PP3 in the third direction D3 and the heights of the bottom surfaces of the linear portion LP, the first protruding portion PP1, and the second protruding portion PP2 may refer to a distance from the top surface of the substrate 100 to the respective bottom surfaces of the linear portion LP, the first protruding portion PP1, and the second protruding portion PP2 in the third direction D3. A top surface of the linear portion LP may be coplanar with top surfaces of the first to third protruding portions PP1, PP2, and PP3.

The third protruding portion PP3 may be electrically connected to at least one source/drain region SD. For example, the third protruding portion PP3 may be in contact with the at least one source/drain region SD. The power line PL may apply a power voltage or a ground voltage to the at least one source/drain region SD through the third protruding portion PP3.

Figure 3:
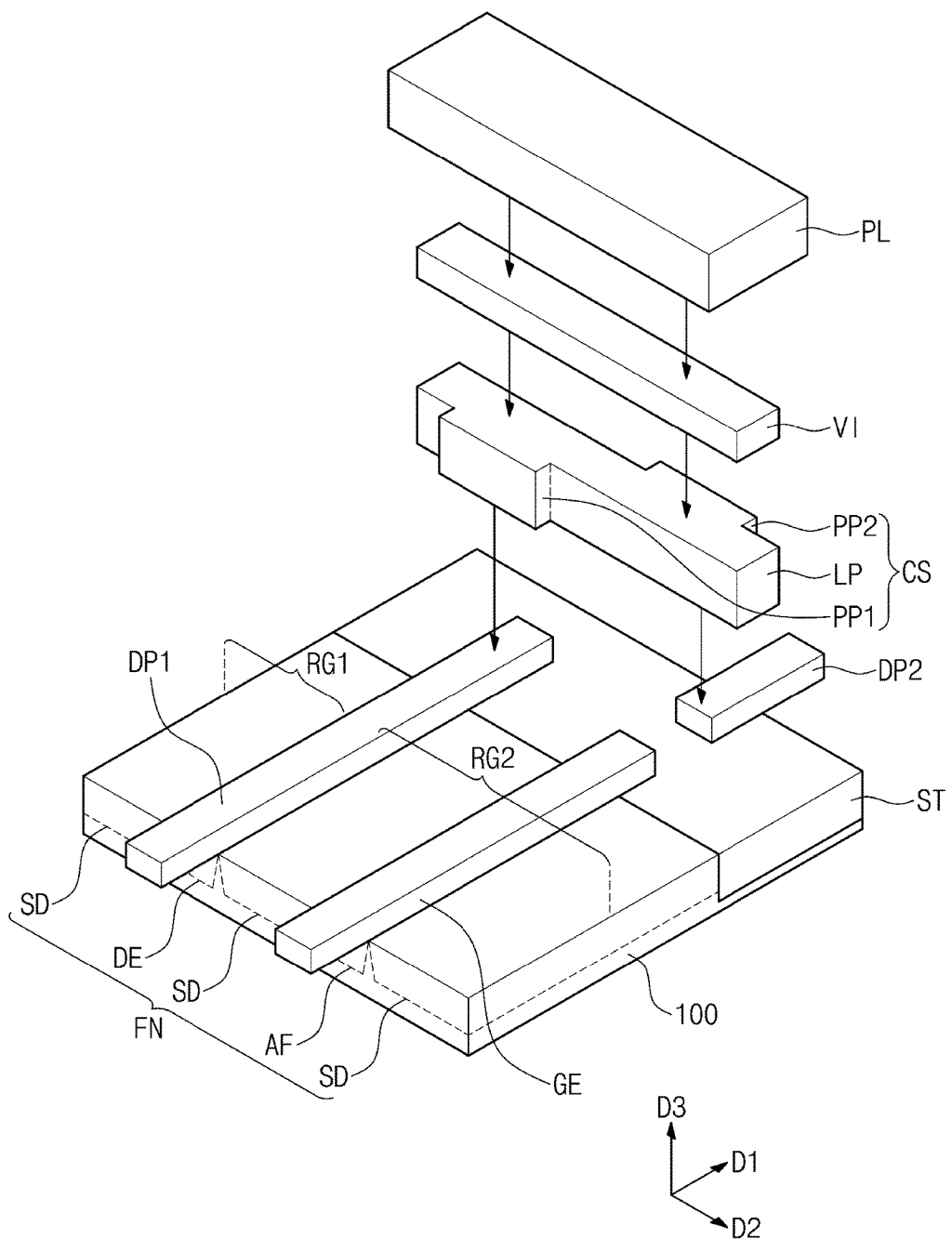
FIG. 3 is a perspective view illustrating a semiconductor device according to some exemplary embodiments of the present disclosure.

FIG. 3 is a perspective view illustrating a semiconductor device according to some embodiments of the present disclosure. In this exemplary embodiment, the descriptions to the same technical features as in the above embodiment of FIG. 1 will be omitted or mentioned briefly for the purpose of ease and convenience in explanation. For example, differences between this exemplary embodiment and the embodiment of FIG. 1 will be mainly described hereinafter.

Referring to FIG. 3, a gate electrode GE and a first dummy gate electrode DP1 may be disposed to cross over the active pattern FN. A second dummy gate electrode DP2 may be disposed to be adjacent to the gate electrode GE. The second dummy gate electrode DP2 and the gate electrode GE may be parallel to each other and may be arranged in the first direction D1. Even though not shown in the drawings, the second dummy gate electrode DP2 may extend onto another active pattern adjacent to the device isolation pattern ST.

A first protruding portion PP1 of the contact structure CS may be in contact with a top surface of the first dummy gate electrode DP1, and a second protruding portion PP2 of the contact structure CS may be in contact with a top surface of the second dummy gate electrode DP2. Unlike the contact structure CS illustrated in FIG. 1, the first protruding portion PP1 and the second protruding portion PP2 may not be aligned with each other in the first direction D1. The second protruding portion PP2 may be offset from the first protruding portion PP1. This may be because the first dummy gate electrode DP1 is not aligned with the second dummy gate electrode DP2 in the first direction D1.

Figure 4:
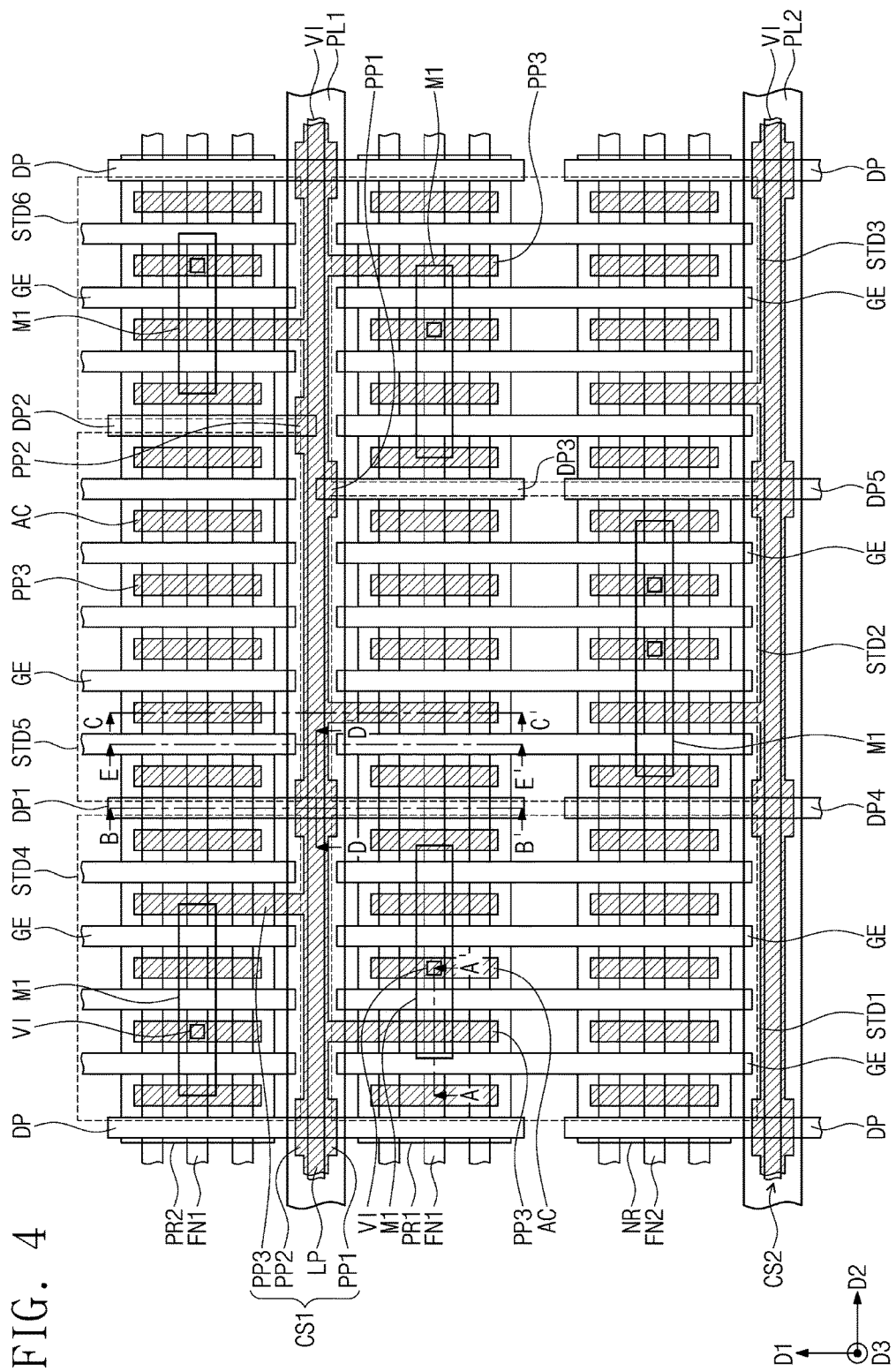
FIG. 4 is a plan view illustrating a semiconductor device according to some exemplary embodiments of the present disclosure.

FIG. 4 is a plan view illustrating a semiconductor device according to some embodiments of the present disclosure. FIGS. 5A to 5E are cross-sectional views taken along lines A-A', B-B', C-C', D-D', and E-E' of FIG. 4, respectively. In this exemplary embodiment, the descriptions to the same technical features as in the above embodiments of FIGS. 1 to 3 will be omitted or mentioned briefly for the purpose of ease and convenience in explanation. For example, differences between this exemplary embodiment and the embodiments of FIGS. 1 to 3 will be mainly described hereinafter.

Referring to FIGS. 4 and 5A to 5E, first to sixth standard cells STD1 to STD6 may be provided on a substrate 100. The first to third standard cells STD1, STD2, and STD3 may be arranged in a second direction D2. For example, the second standard cell STD2 may be arranged between the first standard cell STD1 and the third standard cell STD3 in the second direction D2. The fourth to sixth standard cells STD4, STD5, and STD6 may be arranged in the second direction D2. For example, the fifth standard cell STD5 may be arranged between the fourth standard cell STD4 and the sixth standard cell STD6 in the second direction D2. The first standard cell STD1 and the fourth standard cell STD4 may be arranged adjacent to each other in a first direction D1. The second standard cell STD2 and the fifth standard cell STD5 may be arranged adjacent to each other in the first direction D1. The third standard cell STD3 and the sixth standard cell STD6 may be arranged adjacent to each other in the first direction D1.

Each of the first to sixth standard cells STD1 to STD6 may be a logic cell region on which logic transistors constituting a logic circuit of a semiconductor device are disposed. For example, logic transistors constituting a process core or an input/output (I/O) terminal may be disposed on each of the first to sixth standard cells STD1 to STD6. Each of the first to sixth standard cells STD1 to STD6 may be a portion of the process core or the I/O terminal. For example, the substrate 100 may be a silicon substrate, a germanium substrate, or a silicon-on-insulator (SOI) substrate.

Second device isolation patterns ST2 may be provided at the substrate 100 to define first and second PMOSFET regions PR1 and PR2 and an NMOSFET region NR. The second device isolation patterns ST2 may be formed in an upper portion of the substrate 100.

The first PMOSFET region PR1 and the NMOSFET region NR may be spaced apart from each other in the first direction D1 with the second device isolation pattern ST2 interposed therebetween. The first PMOSFET region PR1 and the second PMOSFET region PR2 may be spaced apart from each other in the first direction D1 with the second device isolation pattern ST2 interposed therebetween. The first and second PMOSFET regions PR1 and PR2 and the NMOSFET region NR may extend in the second direction D2. The first PMOSFET region PR1 and the NMOSFET region NR may cross over the first to third standard cells STD1, STD2, and STD3. The second PMOSFET region PR2 may cross over the fourth to sixth standard cells STD4, STD5, and STD6. Even though not shown in the drawings, the second device isolation patterns ST2 may define additional PMOSFET regions and additional NMOSFET regions as well as the first and second PMOSFET regions PR1 and PR2 and the NMOSFET region NR.

A plurality of first active patterns FN1 extending in the second direction D2 may be provided on each of the first and second PMOSFET regions PR1 and PR2. A plurality of second active patterns FN2 extending in the second direction D2 may be provided on the NMOSFET region NR. The first and second active patterns FN1 and FN2 may be portions of the substrate 100, which protrude from a top surface of the substrate 100. The first and second active patterns FN1 and FN2 may be arranged along the first direction D1. First device isolation patterns ST1 extending in the second direction D2 may be disposed at both sides (e.g., opposite sides) of each of the first and second active patterns FN1 and FN2.

Upper portions of the first and second active patterns FN1 and FN2 may vertically protrude more than the first device isolation patterns ST1. Each of the upper portions of the first and second active patterns FN1 and FN2 may have a fin shape protruding from between a pair of the first device isolation patterns ST1.

Figure 5A:
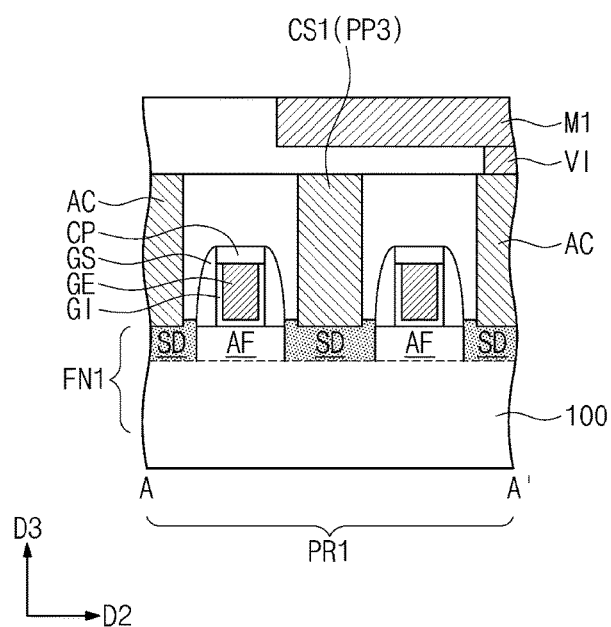
Figure 5B:
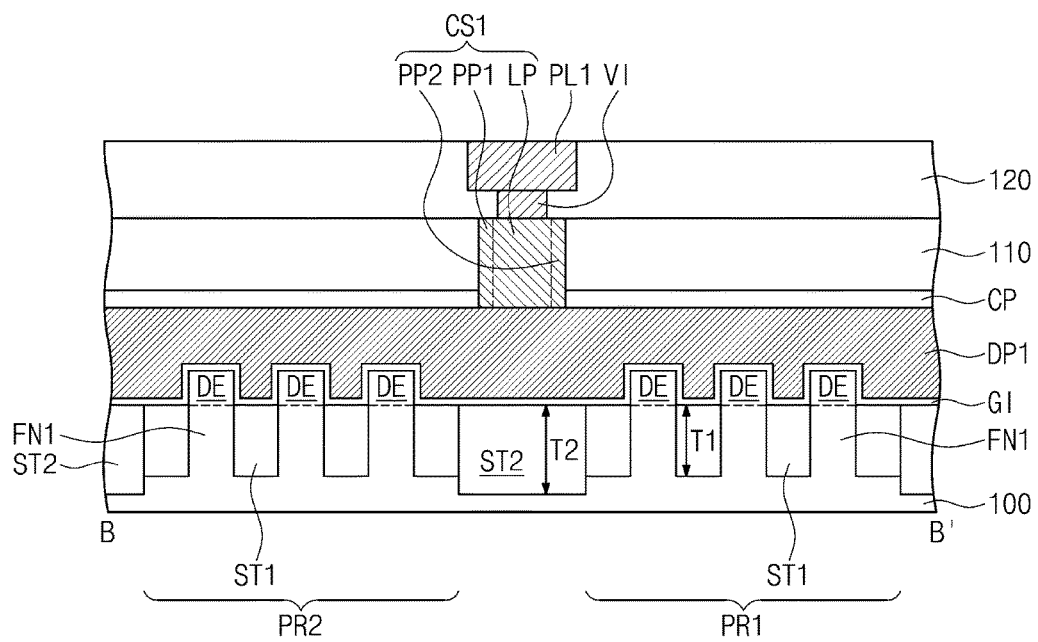
Figure 5C:
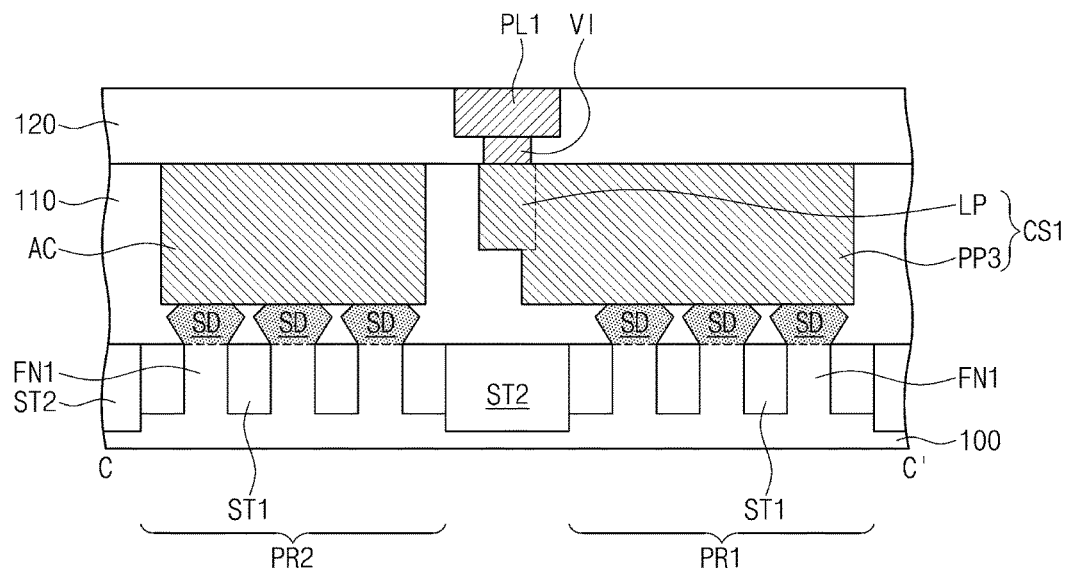
Figure 5D:
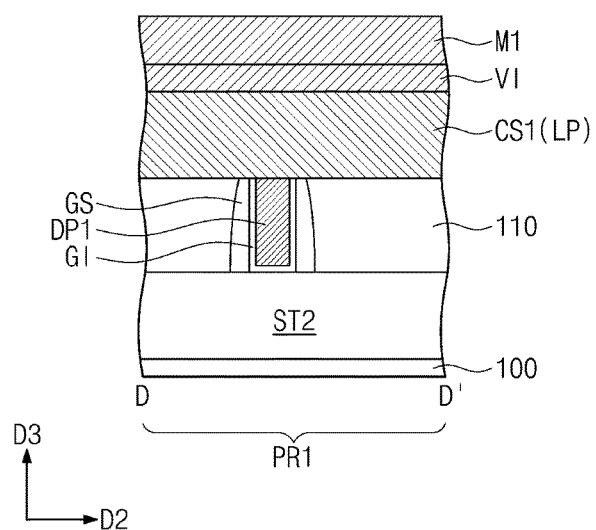

The second device isolation patterns ST2 and the first device isolation pattern ST1 may be connected to each other to constitute a continuous insulating layer. Thicknesses of the second device isolation patterns ST2 may be greater than thicknesses of the first device isolation patterns ST1. For example, as illustrated in FIG. 5B, thicknesses T1 of the first device isolation patterns ST1 in a direction perpendicular to a top surface of the substrate 100 may be smaller than thicknesses T2 of the second device isolation patterns ST2 in the direction perpendicular to the top surface of the substrate 100. In one embodiment, the first device isolation patterns ST1 may be formed by a process different from a process of forming the second device isolation patterns ST2. For example, in some embodiments, the first device isolation patterns ST1 may be formed to have depths shallower than those of the second device isolation patterns ST2. In some embodiments, the first and second device isolation patterns ST1 and ST2 may include silicon oxide.

Gate electrodes GE extending in the first direction D1 may be provided to cross over the first and second active patterns FN1 and FN2. The gate electrodes GE may be spaced apart from each other in the second direction D2. The gate electrodes GE may be selectively provided in the first to sixth standard cells STD1 to STD6.

In some embodiments, the gate electrodes GE in the first standard cell STD1 may extend in the first direction D1 to cross over the NMOSFET region NR, the second device isolation pattern ST2, and the first PMOSFET region PR1. The gate electrodes GE in the first standard cell STD1 may not extend beyond a boundary of the first standard cell STD1 in the first direction D1. The gate electrodes GE in the first standard cell STD1 may not cross over a region between the first standard cell STD1 and the fourth standard cell STD4. In some embodiments, the gate electrodes GE in the fourth standard cell STD4 may extend in the first direction D1 to cross over the second PMOSFET region PR2. The gate electrodes GE in the fourth standard cell STD4 may not extend beyond a boundary of the fourth standard cell STD4 in the first direction D1. The gate electrodes GE in the fourth standard cell STD4 may be spaced apart from the gate electrodes GE in the first standard cell STD1 in the first direction D1.

Dummy gate electrodes DP extending in the first direction D1 may be provided to cross over the first and second active patterns FN1 and FN2. The dummy gate electrodes DP may have substantially the same structure as the gate electrodes GE and may include substantially the same material as the gate electrodes GE. The dummy gate electrodes DP may be provided at boundaries of the first to sixth standard cells STD1 to STD6. The dummy gate electrodes DP may include first to fifth dummy gate electrodes DP1 to DP5.

The first dummy gate electrode DP1 may be provided at the boundary between the first and second standard cells STD1 and STD2 and the boundary between the fourth and fifth standard cells STD4 and STD5. The second dummy gate electrode DP2 may be provided at the boundary between the fifth and sixth standard cells STD5 and STD6. The third dummy gate electrode DP3 may be provided at the boundary between the second and third standard cells STD2 and STD3. The fourth dummy gate electrode DP4 may be provided at the boundary between the first and second standard cells STD1 and STD2. The fifth dummy gate electrode DP5 may be provided at the boundary between the second and third standard cells STD2 and STD3.

The first and fourth dummy gate electrodes DP1 and DP4 may be spaced apart from each other in the first direction D1. The third and fifth dummy gate electrodes DP3 and DP5 may be spaced apart from each other in the first direction D1. The second and third dummy gate electrodes DP2 and DP3 may not be aligned with each other in the first direction D1. The second and third dummy gate electrodes DP2 and DP3 may be offset from each other (see FIG. 4).

The first to third dummy gate electrodes DP1, DP2, and DP3 may cross over at least one of the first and second PMOSFET regions PR1 and PR2. The first to third dummy gate electrodes DP1, DP2, and DP3 may not extend onto the NMOSFET region NR. The fourth and fifth dummy gate electrodes DP4 and DP5 may cross over the NMOSFET region NR. The fourth and fifth dummy gate electrodes DP4 and DP5 may not extend onto the first and second PMOSFET regions PR1 and PR2.

A gate insulating pattern GI may be provided under each of the gate electrodes GE and the dummy gate electrodes DP. Gate spacers GS may be provided on both sidewalls (e.g., opposite sidewalls) of each of the gate electrodes GE and the dummy gate electrodes DP. A capping pattern CP may be provided to cover a top surface of each of the gate electrodes GE and the dummy gate electrodes DP. A portion of the capping pattern CP may be removed from a portion of the dummy gate electrode DP connected to a contact structure CS1 or CS2 to be described later. The gate insulating pattern GI may vertically extend to cover the both sidewalls of the gate electrode GE (or the dummy gate electrode DP). Thus, the gate insulating pattern GI may be disposed between the gate electrode GE (or the dummy gate electrode DP) and the gate spacers GS. First and second interlayer insulating layers 110 and 120 may be provided to cover the first and second active patterns FN1 and FN2, the gate electrodes GE, and the dummy gate electrodes DP. For example, the first interlayer insulating layer 110 may be provided on top surfaces of the first and second active patterns FN1 and FN2, the gate electrodes GE, and the dummy gate electrodes DP and the second interlayer insulating layer 120 may be provided on top surface of the first interlayer insulating layer 110.

The gate electrodes GE and the dummy gate electrodes DP may include at least one of a doped semiconductor material, a conductive metal nitride, or a metal. The gate insulating pattern GI may include at least one of a silicon oxide layer, a silicon oxynitride layer, or a high-k dielectric layer of which a dielectric constant is higher than that of a silicon oxide layer. Each of the capping pattern CP and the gate spacer GS may include at least one of silicon oxide, silicon nitride, or silicon oxynitride. Each of the first and second interlayer insulating layers 110 and 120 may include at least one of a silicon oxide layer or a silicon oxynitride layer.

Source/drain regions SD may be provided in upper portions of the first and second active patterns FN1 and FN2. A pair of the source/drain regions SD may be respectively disposed at both sides (e.g., opposite sides) of each of the gate electrodes GE and the dummy gate electrodes DP. The source/drain regions SD on the first and second PMOSFET regions PR1 and PR2 may be P-type dopant regions, and the source/drain regions SD on the NMOSFET region NR may be N-type dopant regions.

Channel regions AF may be provided in the upper portions of the first and second active patterns FN1 and FN2. The channel regions AF may vertically overlap the gate electrodes GE. Each of the channel regions AF may be disposed between a pair of the source/drain regions SD. Depletion regions DE may be provided in the upper portions of the first and second active patterns FN1 and FN2. The depletion regions DE may vertically overlap the dummy gate electrodes DP. Each of the depletion regions DE may be disposed between a pair of the source/drain regions SD.

The source/drain regions SD may include epitaxial patterns formed using a selective epitaxial growth (SEG) process. Top surfaces of the source/drain regions SD may be disposed at a higher level than top surfaces of the channel regions AF and the depletion regions DE. The source/drain regions SD may include a different semiconductor element from the substrate 100. In some embodiments, the source/drain regions SD may include a semiconductor element of which a lattice constant is greater or smaller than that of a semiconductor element of the substrate 100. Since the source/drain regions SD include the different semiconductor element from the substrate 100, compressive stress or tensile stress may be provided to the channel regions AF by the source/drain regions SD.

First and second contact structures CS1 and CS2 and active contacts AC may be provided in the first interlayer insulating layer 110. Top surfaces of the first and second contact structures CS1 and CS2 and top surfaces of the active contacts AC may be substantially coplanar with a top surface of the first interlayer insulating layer 110. The active contacts AC may be disposed on each of the first and second PMOSFET regions PR1 and PR2 and the NMOSFET region NR. The active contacts AC may be disposed between the gate electrodes GE and between the gate electrode GE and the dummy gate electrode DP. The active contacts AC may have linear shapes extending in the first direction D1. Each of the active contacts AC may be connected directly to the source/drain regions SD. In this exemplary embodiment, each of the active contacts AC are in contact with a plurality of the source/drain regions SD. However, embodiments of the present disclosure are not limited thereto. For example, at least one of the active contacts AC may be in contact with one source/drain region SD or two source/drain regions SD.

The first contact structure CS1 may be provided at the boundary between the first and fourth standard cells STD1 and STD4, the boundary between the second and fifth standard cells STD2 and STD5, and the boundary between the third and sixth standard cells STD3 and STD6. The first contact structure CS1 may be disposed on the second device isolation pattern ST2 between the first and second PMOSFET regions PR1 and PR2 (see, e.g., FIG. 5B). The second contact structure CS2 may be provided at other boundaries of the first to third standard cells STD1, STD2, and STD3 opposite to the boundaries at which the first contact structure CS1 is disposed. The second contact structure CS2 may be disposed on the second device isolation pattern ST2 adjacent to the NMOSFET region NR (see, e.g., FIG. 4).

Each of the first and second contact structures CS1 and CS2 may include a linear portion LP extending in the second direction D2, first protruding portions PP1, second protruding portions PP2, and third protruding portions PP3. The first, second, and third protruding portions PP1, PP2, and PP3 may laterally protrude from the linear portion LP. The first protruding portions PP1 and the second protruding portions PP2 of the first and second contact structures CS1 and CS2 may be in contact with the dummy gate electrodes DP. The first protruding portions PP1 and the second protruding portions PP2 may increase contact areas between the dummy gate electrodes DP and the first and second contact structures CS1 and CS2.

Each of the third protruding portions PP3 of the first contact structure CS1 may extend onto the first PMOSFET region PR1 or the second PMOSFET region PR2. Each of the third protruding portions PP3 of the second contact structure CS2 may extend onto the NMOSFET region NR. Each of the third protruding portions PP3 of the first and second contact structures CS1 and CS2 may be connected directly to the source/drain regions SD.

Top surfaces of the third protruding portions PP3 of the first and second contact structures CS1 and CS2 may be disposed at substantially the same level as the top surfaces of the active contacts AC in a direction perpendicular to the substrate 100. Bottom surfaces of the third protruding portions PP3 of the first and second contact structures CS1 and CS2 may be disposed at substantially the same level as bottom surfaces of the active contacts AC in the direction perpendicular to the substrate 100. Other technical features of the linear portion LP and the first to third protruding portions PP1, PP2, and PP3 of each of the first and second contact structures CS1 and CS2 may be substantially the same as described with reference to FIGS. 1 to 3.

The active contacts AC may include the same material as the first and second contact structures CS1 and CS2. For example, the active contacts AC may include at least one of a conductive metal nitride (e.g., titanium nitride or tantalum nitride) or a metal (e.g., aluminum or tungsten).

Even though not shown in the drawings, barrier patterns may be disposed between the first interlayer insulating layer 110 and the contact structures CS1 and CS2 and between the first interlayer insulating layer 110 and the active contacts AC. The barrier patterns may directly cover sidewalls and bottom surfaces of the contact structures CS1 and CS2 and the active contacts AC except the top surfaces of the contact structures CS1 and CS2 and the active contacts AC. The barrier patterns may include a metal nitride (e.g., titanium nitride (TiN)).

First and second power lines PL1 and PL2, first interconnection lines M1, and vias VI may be provided in the second interlayer insulating layer 120. Top surfaces of the first and second power lines PL1 and PL2 and the first interconnection lines M1 may be substantially coplanar with a top surface of the second interlayer insulating layer 120. Each of the first interconnection lines M1 may be formed of a conductive material, for example, a conductive metal nitride (e.g., titanium nitride or tantalum nitride) or a metal (e.g., aluminum or tungsten).

The first power line PL1 may be disposed on the first contact structure CS1. The via VI may be disposed between the first power line PL1 and the first contact structure CS1. The first power line PL1 may be electrically connected to the first contact structure CS1 through the via VI. The second power line PL2 may be disposed on the second contact structure CS2. The via VI may be disposed between the second power line PL2 and the second contact structure CS2. The second power line PL2 may be electrically connected to the second contact structure CS2 through the via VI. Even though not shown in the drawings, the first power line PL1 and the via VI connected thereto may constitute one body, and the second power line PL2 and the via VI connected thereto may constitute one body. For example, in some embodiments, the first power line PL1 and the via VI may be integrally formed to constitute one body, and the second power line PL2 and the via VI may be integrally formed to constitute one body.

The first power line PL1 may apply a power voltage to the first to third dummy gate electrodes DP1, DP2, and DP3 through the via VI and the first contact structure CS1. Thus, the depletion regions DE may be formed in the first active patterns FN1 under the first to third dummy gate electrodes DP1, DP2, and DP3.

In some embodiments, the first dummy gate electrode DP1 may prevent carriers in the first active patterns FN1 from moving between the first and second standard cells STD1 and STD2. The first active patterns FN1 of the first standard cell STD1 may be electrically isolated from the first active patterns FN1 of the second standard cell STD2. In addition, the first dummy gate electrode DP1 may prevent carriers in the first active patterns FN1 from moving between the fourth and fifth standard cells STD4 and STD5. The first active patterns FN1 of the fourth standard cell STD4 may be electrically isolated from the first active patterns FN1 of the fifth standard cell STD5. The second and third dummy gate electrodes DP2 and DP3 may also prevent movement of carriers between adjacent standard cells.

The second power line PL2 may apply a ground voltage to the fourth and fifth dummy gate electrodes DP4 and DP5 through the via VI and the second contact structure CS2. Thus, the depletion regions DE may be formed in the second active patterns FN2 under the fourth and fifth dummy gate electrodes DP4 and DP5.

In some embodiments, the fourth dummy gate electrode DP4 may prevent carriers in the second active patterns FN2 from moving between the first and second standard cells STD1 and STD2. The second active patterns FN2 of the first standard cell STD1 may be electrically isolated from the second active patterns FN2 of the second standard cell STD2. The fifth dummy gate electrode DP5 may also prevent movement of carriers between adjacent standard cells.

The first interconnection lines M1 may be disposed on the active contacts AC. Vias VI may be disposed between the first interconnection lines M1 and the active contacts AC. The first interconnection lines M1 may be electrically connected to the active contacts AC through the vias VI. Even though not shown in the drawings, the first interconnection line M1 and the via VI connected thereto may constitute one body. For example, the first interconnection line M1 and the via VI may be integrally formed to constitute one body.

Even though not shown in the drawings, barrier patterns may be disposed between the second interlayer insulating layer 120 and the power lines PL1 and PL2 and between the second interlayer insulating layer 120 and the first interconnection lines M1.

According to some embodiments of the present disclosure, the dummy gate electrodes DP may electrically isolate the adjacent standard cells from each other. A distance between the adjacent standard cells may be substantially equal to a width of the dummy gate electrode DP, and thus an entire area of the semiconductor device may be reduced. In addition, since an additional insulating structure for isolating the standard cells is not needed, processes of manufacturing the semiconductor device may be efficient or simplified.

Figure 6:
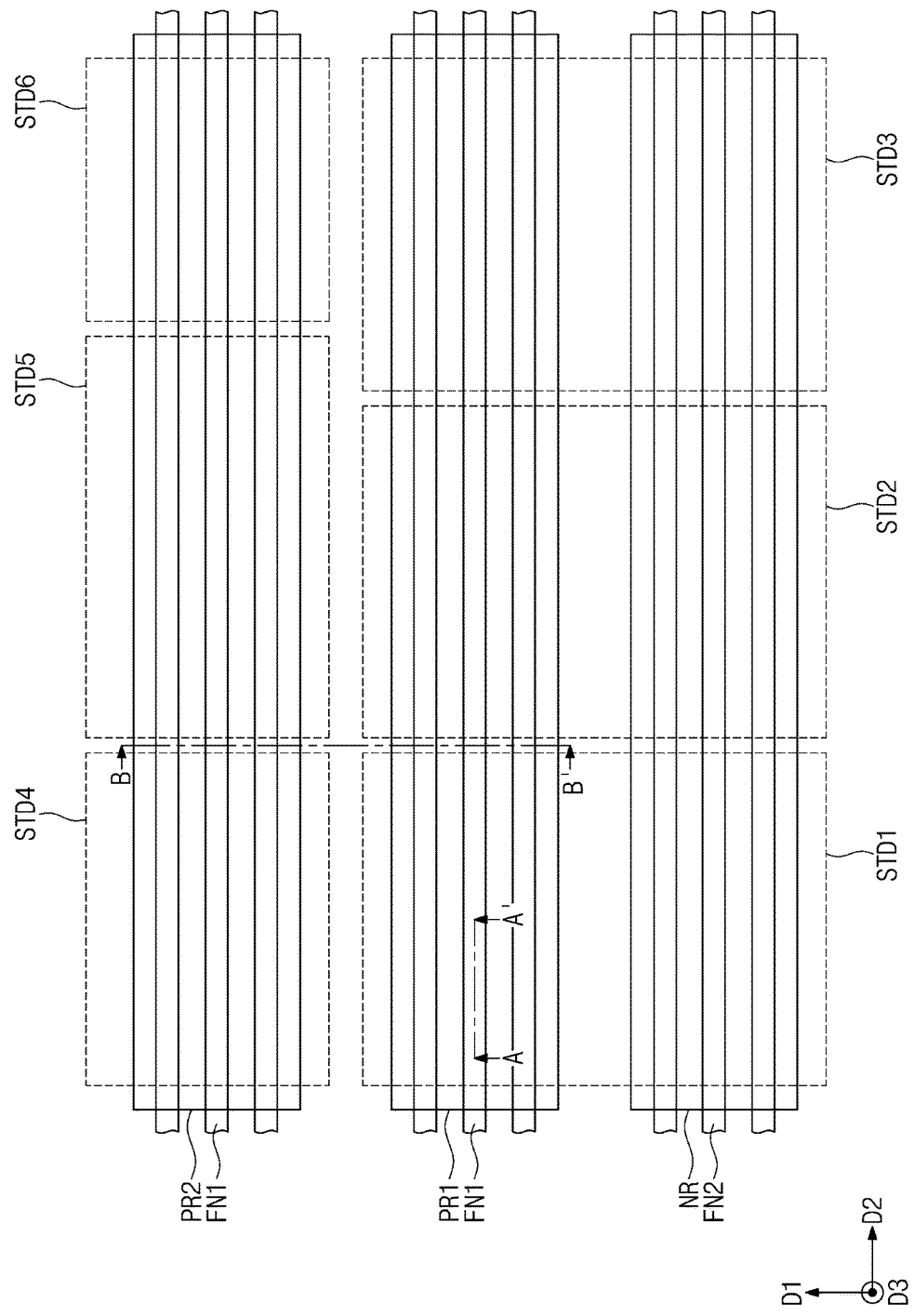
FIGS. 6, 8, and 10 are plan views illustrating a method of manufacturing a semiconductor device, according to some exemplary embodiments of the present disclosure.
Figure 7A:
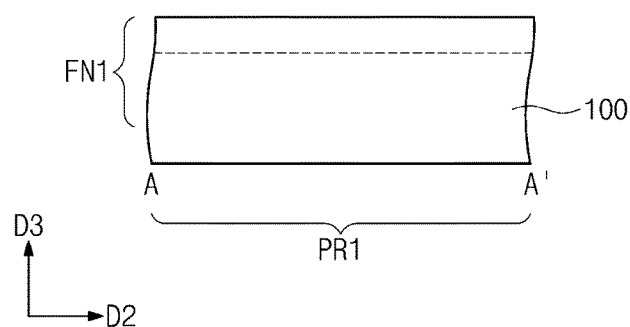
FIGS. 7A, 9A, and 11A are cross-sectional views taken along lines A-A' of FIGS. 6, 8, and 10, respectively.
Figure 7B:
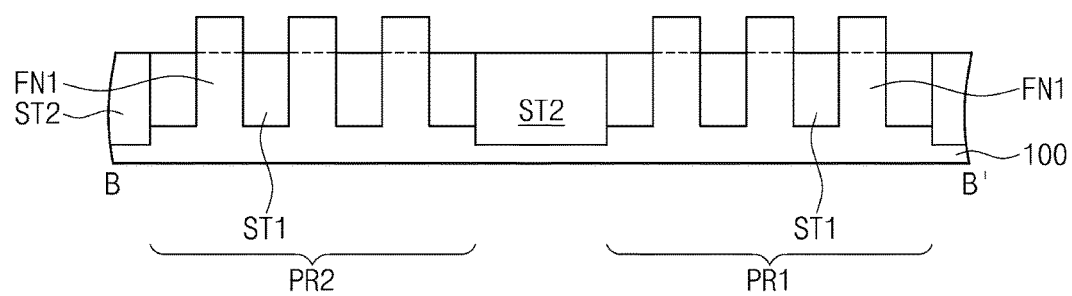
FIGS. 7B, 9B, and 11B are cross-sectional views taken along lines B-B' of FIGS. 6, 8, and 10, respectively.
Figure 8:
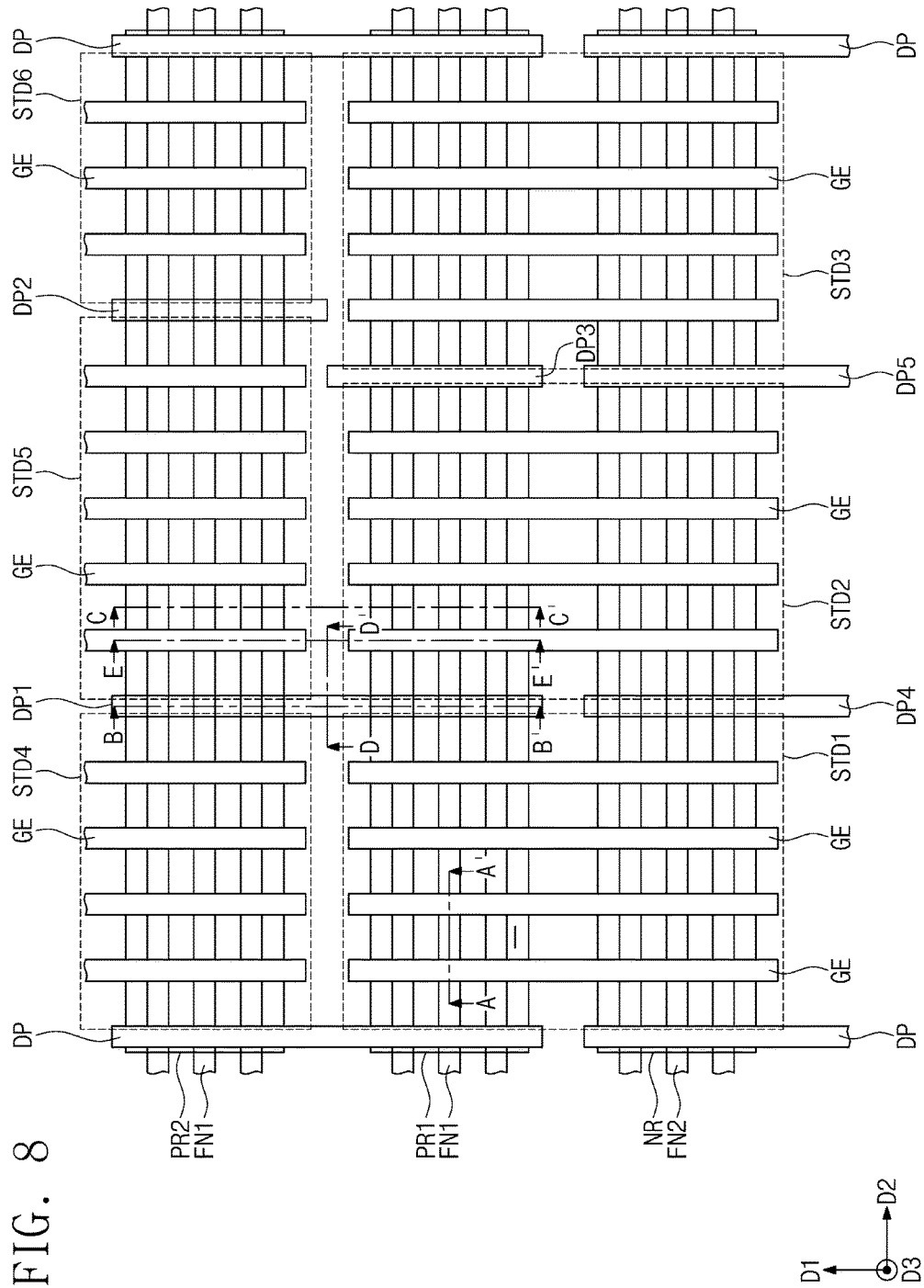
Figure 9A:
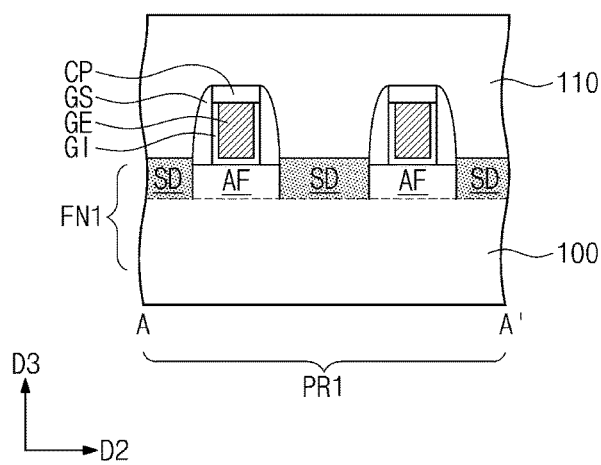
Figure 9B:
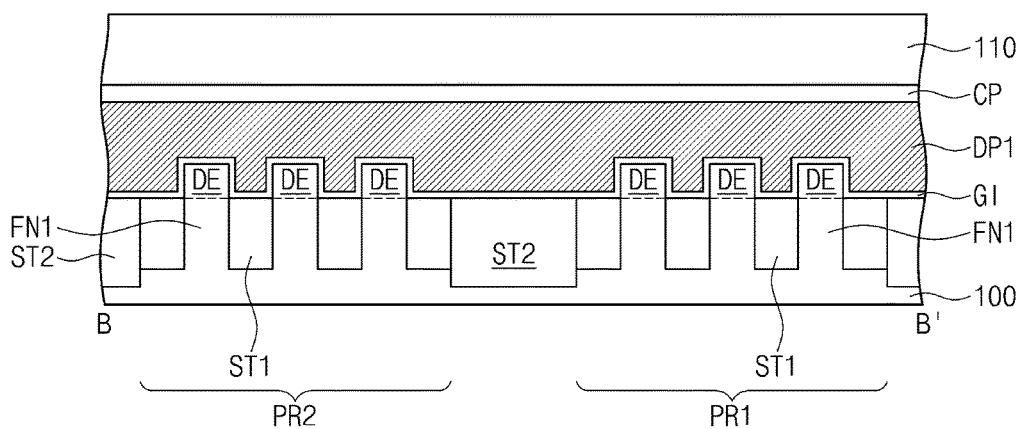
Figure 9C:
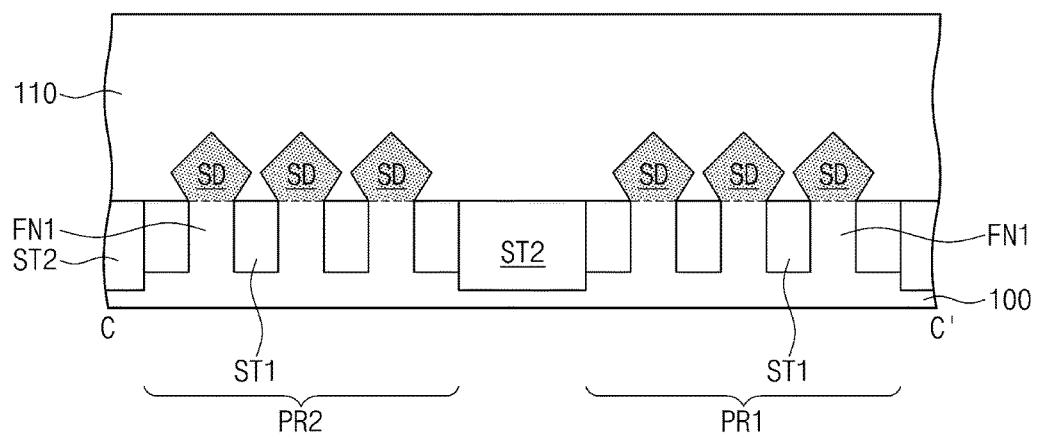
FIGS. 9C and 11C are cross-sectional views taken along lines C-C' of FIGS. 8 and 10, respectively.
Figure 9D:
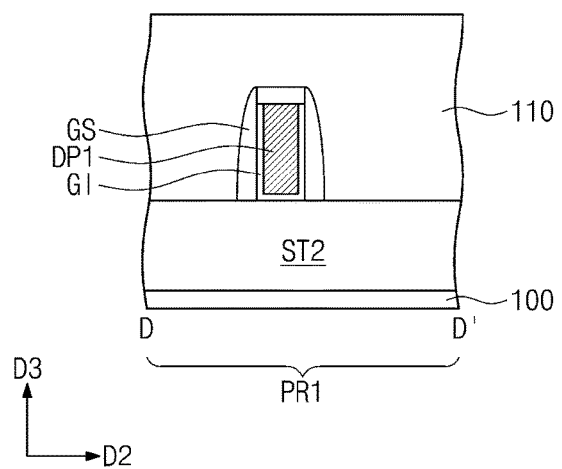
FIGS. 9D and 11D are cross-sectional views taken along lines D-D' of FIGS. 8 and 10, respectively.
Figure 9E:
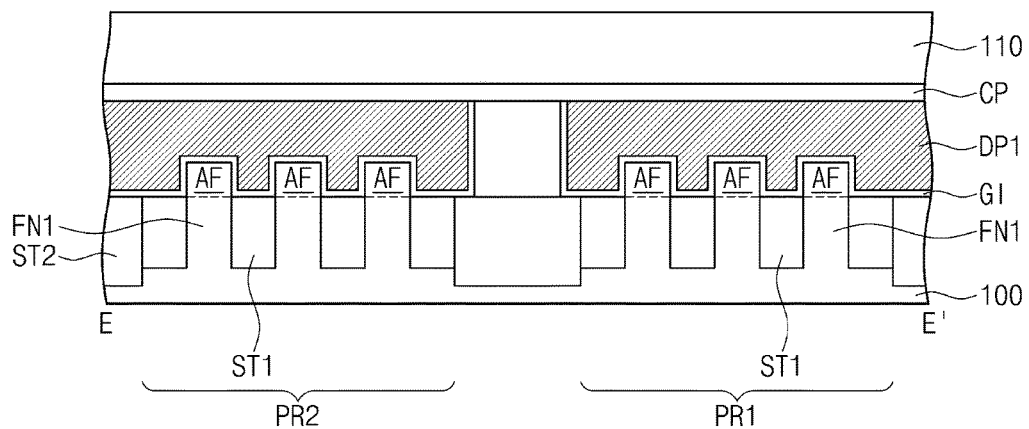
FIGS. 9E and 11E are cross-sectional views taken along lines E-E' of FIGS. 8 and 10, respectively.
Figure 10:
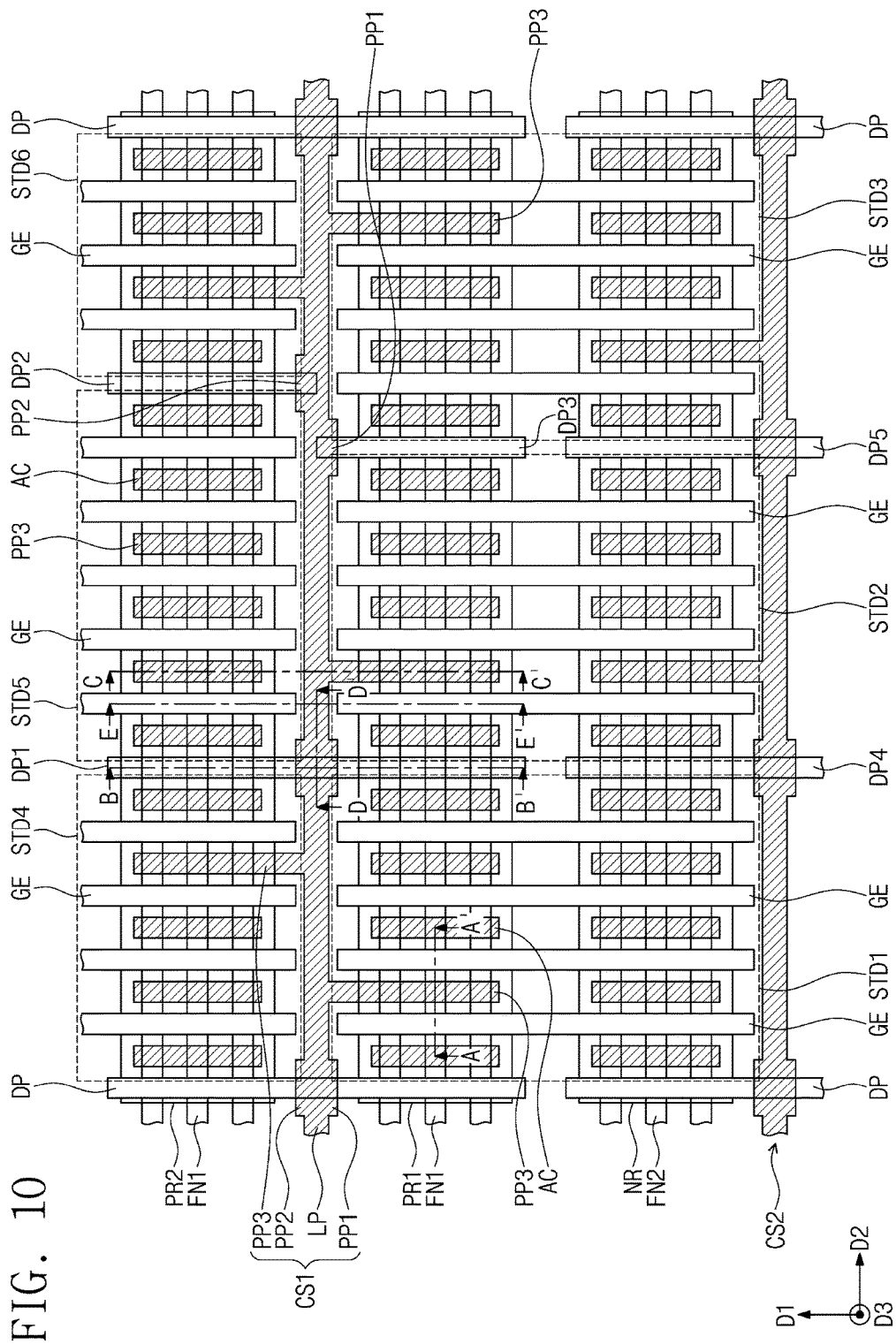
Figure 11A:
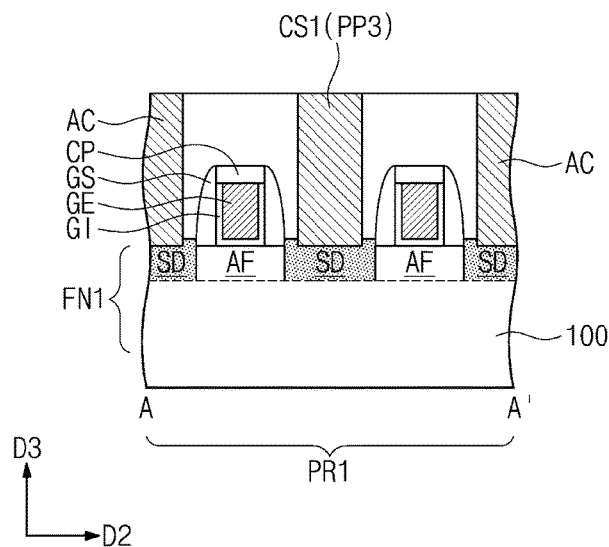
Figure 11B:
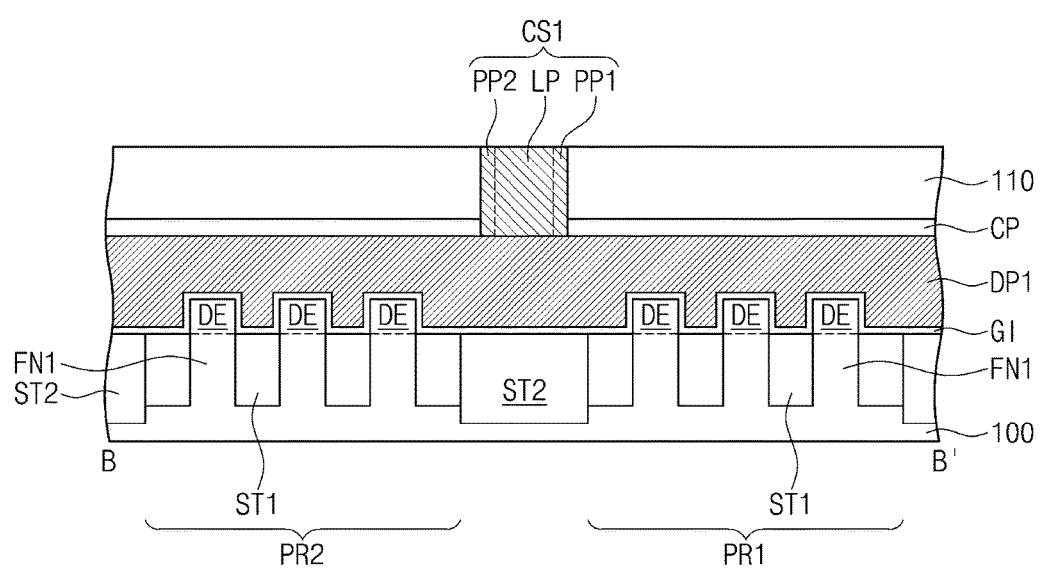
Figure 11C:
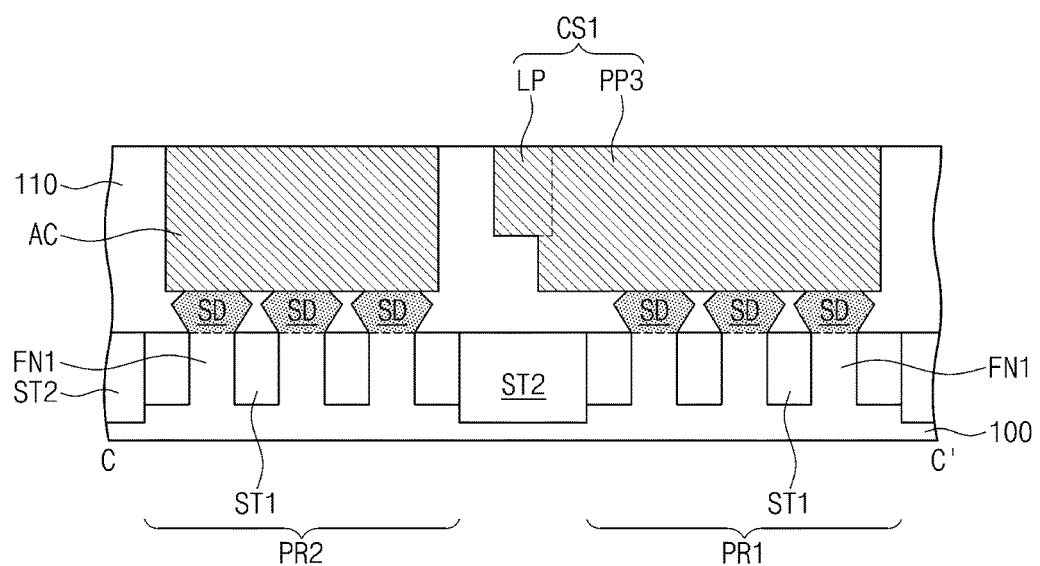
Figure 11D:
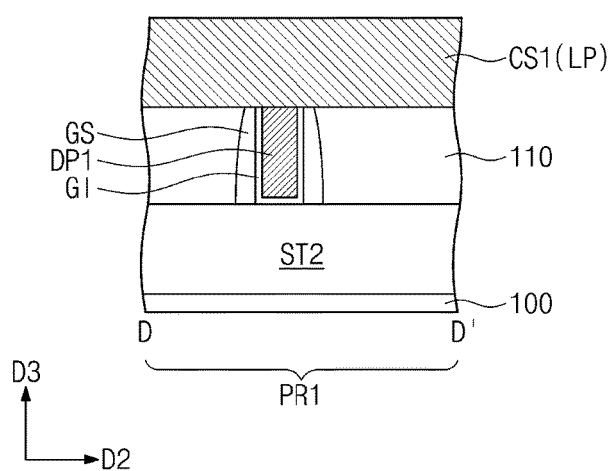
Figure 11E:
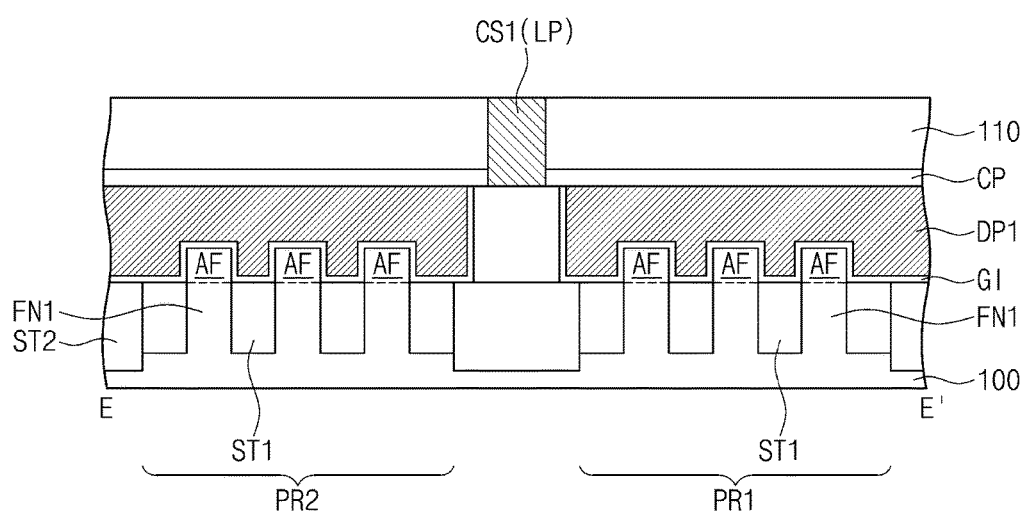

FIGS. 6, 8, and 10 are plan views illustrating a method of manufacturing a semiconductor device, according to some embodiments of the present disclosure. FIGS. 7A, 9A, and 11A are cross-sectional views taken along lines A-A' of FIGS. 6, 8, and 10, respectively, and FIGS. 7B, 9B, and 11B are cross-sectional views taken along lines B-B' of FIGS. 6, 8, and 10, respectively. FIGS. 9C and 11C are cross-sectional views taken along lines C-C' of FIGS. 8 and 10, respectively, and FIGS. 9D and 11D are cross-sectional views taken along lines D-D' of FIGS. 8 and 10, respectively. FIGS. 9E and 11E are cross-sectional views taken along lines E-E' of FIGS. 8 and 10, respectively.

Referring to FIGS. 6, 7A, and 7B, a substrate 100 having first to sixth standard cells STD1 to STD6 may be provided. For example, the substrate 100 may be a silicon substrate, a germanium substrate, or a silicon-on-insulator (SOI) substrate. An upper portion of the substrate 100 may be patterned to form active patterns. The active patterns may include first and second active patterns FN1 and FN2.

First device isolation patterns ST1 may be formed to fill spaces between the active patterns FN1 and FN2. The first device isolation patterns ST1 may be recessed to expose upper portions of the active patterns FN1 and FN2. Second device isolation patterns ST2 may be formed on the substrate 100 to define a first PMOSFET region PR1, a second PMOSFET region PR2, and an NMOSFET region NR. In some embodiments, when the second device isolation patterns ST2 are formed, the active patterns on a residual region except the first and second PMOSFET regions PR1 and PR2 and the NMOSFET region NR may be removed. The active patterns remaining on the first and second PMOSFET regions PR1 and PR2 may be the first active patterns FN1, and the active patterns remaining on the NMOSFET region NR may be the second active patterns FN2.

The first and second device isolation patterns ST1 and ST2 may be formed by a shallow-trench isolation (STI) process. The first and second device isolation patterns ST1 and ST2 may be formed using, for example, silicon oxide. In some embodiments, the first device isolation patterns ST1 may be formed to have depths shallower than those of the second device isolation patterns ST2. In one embodiment, the first device isolation patterns ST1 may be formed by a process different from a process of forming the second device isolation patterns ST2. In certain embodiments, the first device isolation patterns ST1 may be formed to have substantially the same depth as the second device isolation patterns ST2. In one embodiment, the first device isolation patterns ST1 may be formed simultaneously with the second device isolation patterns ST2.

Referring to FIGS. 8 and 9A to 9E, gate electrodes GE and dummy gate electrodes DP extending in a first direction D1 may be formed to cross over the first and second active patterns FN1 and FN2. The gate electrodes GE and the dummy gate electrodes DP may be spaced apart from each other in a second direction D2. The dummy gate electrodes DP may be formed at boundaries of the first to sixth standard cells STD1 to STD6. The dummy gate electrodes DP may include first to fifth dummy gate electrodes DP1 to DP5. Source/drain regions SD may be formed at upper portions of the first and second active patterns FN1 and FN2. The source/drain regions SD may be formed at both sides (opposite sides) of each of the gate electrodes GE and the dummy gate electrodes DP. The source/drain regions SD on the first and second PMOSFET regions PR1 and PR2 may be doped with P-type dopants, and the source/drain regions SD on the NMOSFET region NR may be doped with N-type dopants.

The gate electrodes GE and the dummy gate electrodes DP may be formed at the same time. In some embodiments, forming the gate electrodes GE and the dummy gate electrodes DP may include forming sacrificial patterns crossing the first and second active patterns FN1 and FN2, forming gate spacers GS on both sidewalls (opposite sidewalls) of each of the sacrificial patterns, and replacing the sacrificial patterns with the gate electrodes GE and the dummy gate electrodes DP.

A gate insulating pattern GI may be formed under each of the gate electrodes GE and the dummy gate electrodes DP. A capping pattern CP may be formed to cover a top surface of each of the gate electrodes GE and the dummy gate electrodes DP.

The gate electrodes GE and the dummy gate electrodes DP may include at least one of a doped semiconductor material, a metal, or a conductive metal nitride. The gate insulating pattern GI may include at least one of a silicon oxide layer, a silicon oxynitride layer, or a high-k dielectric layer of which a dielectric constant is higher than that of a silicon oxide layer. Each of the capping pattern CP and the gate spacer GS may include at least one of silicon oxide, silicon nitride, or silicon oxynitride.

The source/drain regions SD may be formed at both sides (opposite sides) of each of the sacrificial patterns before replacing the sacrificial patterns with the gate electrodes GE and the dummy gate electrodes DP. In some embodiments, the source/drain regions SD may include epitaxial patterns formed by a selective epitaxial growth (SEG) process. In some embodiments, portions of the first and second active patterns FN1 and FN2 disposed at both sides (opposite sides) of each of the sacrificial patterns may be recessed, and then, the SEG process may be performed on the recessed regions of the first and second active patterns FN1 and FN2. The SEG process may be formed using a different semiconductor element from the substrate 100. For example, the source/drain regions SD may be formed of a semiconductor element of which a lattice constant is greater or smaller than that of the semiconductor element of the substrate 100. Since the source/drain regions SD are formed of the different semiconductor element from the substrate 100, compressive stress or tensile stress may be provided to channel regions AF between the source/drain regions SD.

A first interlayer insulating layer 110 may be formed to cover the source/drain regions SD and the sacrificial patterns. The first interlayer insulating layer 110 may be formed of a silicon oxide layer or a silicon oxynitride layer.

Referring to FIGS. 10 and 11A to 11E, first and second contact structures CS1 and CS2 and active contacts AC may be formed in the first interlayer insulating layer 110. The active contacts AC may be formed on the source/drain regions SD of the first and second PMOSFET regions PR1 and PR2 and the NMOSFET region NR. The active contacts AC may have linear or bar shapes extending in the first direction D1.

The first contact structure CS1 may be formed on the second device isolation pattern ST2 between the first and second PMOSFET regions PR1 and PR2. The second contact structure CS2 may be formed on the second device isolation pattern ST2 adjacent to the NMOSFET region NR. The first and second contact structures CS1 and CS2 may be formed to be in contact with the dummy gate electrodes DP.

The first and second contact structures CS1 and CS2 and the active contacts AC may be formed at the same time. In some embodiments, the first interlayer insulating layer 110 may be patterned to form holes that define the first and second contact structures CS1 and CS2 and the active contacts AC. The holes may be formed by performing a plurality of photolithography processes using different photomasks. For example, the holes may not be formed at the same time. The first and second contact structures CS1 and CS2 and the active contacts AC may be formed by filling the holes with a conductive material. The conductive material may include at least one of a conductive metal nitride or a metal.

Referring again to FIGS. 4 and 5A to 5E, a second interlayer insulating layer 120 may be formed on the first interlayer insulating layer 110. The second interlayer insulating layer 120 may be formed of a silicon oxide layer or a silicon oxynitride layer.

First and second power lines PL1 and PL2, first interconnection lines M1, and vias VI may be formed in the second interlayer insulating layer 120. The first power line PL1 may be formed to vertically overlap the first contact structure CS1, and the second power line PL2 may be formed to vertically overlap the second contact structure CS2. The first interconnection lines M1 may be formed on the active contacts AC. A line-shaped via VI may be formed between the first power line PL1 and the first contact structure CS1, and a line-shaped via VI may be formed between the second power line PL2 and the second CS2. Some of the vias VI may be formed between the first interconnection lines M1 and the active contacts AC.

The first and second power lines PL1 and PL2, the first interconnection lines M1, and the vias VI may be formed at the same time. In some embodiments, the second interlayer insulating layer 120 may be patterned to form holes that define the first and second power lines PL1 and PL2, the first interconnection lines M1, and the vias VI. The holes may be formed by performing a plurality of photolithography processes using different photomasks. For example, the holes may not be formed at the same time. The first and second power lines PL1 and PL2, the first interconnection lines M1, and the vias VI may be formed by filling the holes with a conductive material. The conductive material may include at least one of a conductive metal nitride or a metal.

According to some embodiments of the present disclosure, adjacent standard cells may be electrically isolated from each other by using the dummy gate electrodes DP formed together with the gate electrodes GE. For example, since an additional insulating structure for isolating the standard cells is not needed, processes of manufacturing the semiconductor device may be efficient or simplified.

In the semiconductor device according to some embodiments of the present disclosure, the adjacent standard cells may be electrically isolated from each other by the dummy gate electrode connected to the power line. Thus, the entire area of the semiconductor device may be reduced and electrical characteristics of the semiconductor device may be improved. In addition, since an additional insulating structure for isolating the standard cells is not needed, the processes of manufacturing the semiconductor device may be efficient or simplified.

While the present disclosure have been described with reference to example embodiments, it will be apparent to those skilled in the art that various changes and modifications may be made without departing from the spirits and scopes of the present disclosure. Therefore, it should be understood that the above embodiments are not limiting, but illustrative. Thus, the scopes of the present disclosure are to be determined by the broadest permissible interpretation of the following claims and their equivalents, and shall not be restricted or limited by the foregoing description.

What is claimed is:

1. A semiconductor device comprising:
   a first active pattern extending in a first direction on a first region and a second region of a substrate;
   a first dummy gate electrode extending in a second direction crossing the first active pattern between the first region and the second region, the first dummy gate electrode overlapping the first active pattern between the first region and the second region when viewed in a plan view;
   a contact structure contacting the first dummy gate electrode and extending in the first direction; and
   a power line disposed on the contact structure and electrically connected to the first dummy gate electrode through the contact structure, the power line extending in the first direction,
   wherein the contact structure overlaps the power line when viewed in a plan view.

2. The semiconductor device of claim 1, wherein the contact structure comprises:
   a linear portion having a linear shape extending in the first direction; and
   a first protruding portion protruding from the linear portion in the second direction.

3. The semiconductor device of claim 2, wherein the linear portion and the first protruding portion are spaced apart from the first active pattern when viewed in a plan view.

4. The semiconductor device of claim 2, wherein the contact structure further comprises: a second protruding portion protruding from the linear portion in the second direction, and
   wherein the second protruding portion is electrically connected to a source/drain region of the first active pattern.

5. The semiconductor device of claim 4, wherein a height of a bottom surface of the second protruding portion in a direction perpendicular to a top surface of the substrate is different from a height of a bottom surface of the linear portion in the direction perpendicular to the top surface of the substrate.

6. The semiconductor device of claim 1, further comprising:
   a via disposed between the contact structure and the power line and extending in the first direction.

7. The semiconductor device of claim 1, wherein the first dummy gate electrode prevents carriers from moving between the first region and the second region in the first active pattern.

8. The semiconductor device of claim 1, further comprising:
   a gate electrode crossing the first active pattern and extending in the second direction,
   wherein the gate electrode is spaced apart from the contact structure.

9. The semiconductor device of claim 1, further comprising:
   a device isolation pattern disposed on the substrate and defining the first active pattern,
   wherein the contact structure overlaps the device isolation pattern when viewed in a plan view.

10. The semiconductor device of claim 1, further comprising:
    a second active pattern extending in the first direction on a third region and a fourth region of the substrate,
    wherein the first dummy gate electrode crosses the second active pattern, and
    wherein the contact structure is provided between the first region and the third region and between the second region and the fourth region.

11. A semiconductor device comprising:
    a first standard cell, a second standard cell, a third standard cell and a fourth standard cell provided on a substrate;

a first dummy gate electrode provided at a boundary between the first standard cell and the second standard cell;
a contact structure provided at a boundary between the first standard cell and the third standard cell and a boundary between the second standard cell and the fourth standard cell; and
a power line provided at the boundary between the first standard cell and the third standard cell and the boundary between the second standard cell and the fourth standard cell,
wherein the first standard cell and the second standard cell are arranged in a first direction,
wherein the third standard cell and the fourth standard cell are arranged in the first direction,
wherein the first standard cell and the third standard cell are arranged in a second direction crossing the first direction,
wherein the second standard cell and the fourth standard cell are arranged in the second direction, and
wherein the power line applies a voltage to the first dummy gate electrode through the contact structure, such that a depletion region is formed on the boundary between the first standard cell and the second standard cell.

12. The semiconductor device of claim 11, wherein the first dummy gate electrode electrically isolates the first standard cell and the second standard cell from each other.

13. The semiconductor device of claim 11, wherein each of the first standard cell, the second standard cell, the third standard cell, and the fourth standard cell includes logic transistors constituting a logic circuit.

14. The semiconductor device of claim 11, wherein the first dummy gate electrode extends from the boundary between the first standard cell and the second standard cell to a boundary between the third standard cell and the fourth standard cell.

15. The semiconductor device of claim 11, further comprising:

a second dummy gate electrode provided at a boundary between the third standard cell and the fourth standard cell,
wherein the power line applies the voltage to the second dummy gate electrode through the contact structure.

16. A semiconductor device comprising:
an active pattern provided on a substrate extending in a first direction, the active pattern having a pair of source/drain regions and a depletion region between the pair of source/drain regions;
a dummy gate electrode on the depletion region and extending in a second direction crossing the active pattern, the dummy gate electrode overlapping the depletion region of the active pattern when viewed in a plan view;
a contact structure disposed on the dummy gate electrode and connected to the dummy gate electrode, the contact structure extending in the first direction; and
a via and a power line disposed on the contact structure, wherein the via is disposed between the contact structure and the power line, the via having a linear shape extending in the first direction and the power line having a linear shape extending along the via in the first direction,
wherein the power line is electrically connected to the dummy gate electrode through the via and the contact structure, and
wherein the contact structure and the via overlap the power line when viewed in a plan view.

17. The semiconductor device of claim 16, wherein a longitudinal direction of the power line is the first direction.

18. The semiconductor device of claim 16, wherein a width of the power line in the second direction is greater than a width of the via in the second direction.

19. The semiconductor device of claim 16, wherein a width of the power line in the second direction is greater than a width of the contact structure in the second direction.

20. The semiconductor device of claim 16, wherein the power line and the via are integrally formed to constitute one body.

* * * * *